United States Patent
Jeong et al.

(10) Patent No.: US 9,878,627 B2
(45) Date of Patent: Jan. 30, 2018

(54) DEVICE FOR DETECTING LEVEL OF CONTROL PILOT SIGNAL AND CHARGING CONTROL SYSTEM HAVING THE SAME

(71) Applicant: Hyundai Motor Company, Seoul (KR)

(72) Inventors: Jee Hye Jeong, Gyeonggi-do (KR); Jae Won Lee, Gyeonggi-do (KR); Jung Hwan Na, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 366 days.

(21) Appl. No.: 14/622,832

(22) Filed: Feb. 14, 2015

(65) Prior Publication Data
US 2016/0114689 A1    Apr. 28, 2016

(30) Foreign Application Priority Data
Oct. 28, 2014 (KR) .................. 10-2014-0147687

(51) Int. Cl.
*H02J 7/00* (2006.01)
*B60L 11/18* (2006.01)
*G11C 27/02* (2006.01)

(52) U.S. Cl.
CPC ........ *B60L 11/1816* (2013.01); *G11C 27/026* (2013.01); *H02J 7/007* (2013.01)

(58) Field of Classification Search
CPC ................................................. B60L 11/1816

USPC ......................................................... 320/109
See application file for complete search history.

(56) References Cited

U.S. PATENT DOCUMENTS

| | | | |
|---|---|---|---|
| 2002/0000925 A1 | 1/2002 | Martin et al. | |
| 2009/0102435 A1 | 4/2009 | Iwasaki et al. | |
| 2013/0162208 A1* | 6/2013 | Ohnuki | B60L 11/1803 320/109 |
| 2014/0300377 A1* | 10/2014 | Onodera | G01R 31/3004 324/750.3 |

FOREIGN PATENT DOCUMENTS

| | | |
|---|---|---|
| JP | 2009-106029 A | 5/2009 |
| JP | 2014-064439 A | 4/2014 |
| KR | 10-2014-0044018 A | 4/2014 |
| KR | 10-2014-0083387 A | 7/2014 |

\* cited by examiner

*Primary Examiner* — Drew A Dunn
*Assistant Examiner* — Ahmed Omar
(74) *Attorney, Agent, or Firm* — Mintz Levin Cohn Ferris Glovsky and Popeo, P.C.; Peter F. Corless

(57) ABSTRACT

An apparatus for detecting a level of a control pilot signal includes: a switch controller configured to output a switch control signal using a control pilot input signal, which was outputted from an electric vehicle supply equipment; and a sample and hold logic unit configured to sample and hold the control pilot input signal, based on the outputted switch control signal, in order to output a control pilot output signal.

6 Claims, 4 Drawing Sheets

DEVICE FOR DETECTING LEVEL OF CONTROL PILOT SIGNAL AND CHARGING CONTROL SYSTEM HAVING THE SAME

CROSS-REFERENCE TO RELATED APPLICATION

This application claims priority to and the benefit of Korean Patent Application No. 10-2014-0147687, filed on Oct. 28, 2014 in the Korean Intellectual Property Office, the disclosure of which is incorporated herein in its entirety by reference.

TECHNICAL FIELD

The present disclosure relates to a device for detecting a level of a control pilot signal and a charging control system having the same, and more particularly, to a technology of accurately detecting a level of a control pilot signal to accurately apply a charging controlling signal applied to an on-board charger (OBC).

BACKGROUND

As concerns about global environmental pollution continue to grow, the use of clean energy becomes increasingly important. One of the primary causes of air pollution, particularly in major cities, stems from the exhaust gas of a vehicle. In response, the commercial development of electric vehicles (EVs) and plug-in hybrid electric vehicles (PHEVs) has been accelerated.

The electric vehicle and the hybrid vehicle receive electric energy from an external source (e.g., a power plant), charge the electric energy in a battery, and then acquire power, which is mechanical energy, through a motor coupled with a vehicle wheel using the voltage charged in the battery. That is, since the motor is driven with the voltage charged in the battery, the electric vehicle uses a large-capacity chargeable battery and includes a battery charger for charging the large-capacity chargeable battery. Therefore, there is a need to improve battery charging efficiency by accurately sensing a control pilot signal, and the like for charging a battery.

SUMMARY

The present disclosure has been made to solve the above-mentioned problems occurring in the related art while advantages achieved by the related art are maintained intact.

An aspect of the present disclosure provides a device for detecting a level of a control pilot signal and a method thereof capable of accurately detecting the level of the control pilot signal.

According to embodiments of the present disclosure, an apparatus for detecting a level of a control pilot signal includes: a switch controller configured to output a switch control signal using a control pilot input signal, which was outputted from an electric vehicle supply equipment; and a sample and hold logic unit configured to sample and hold the control pilot input signal, based on the outputted switch control signal, in order to output a control pilot output signal.

The sample and hold logic unit may include: a sampler configured to sample the control pilot input signal based on the outputted switch control signal; a buffer unit configured to hold a signal value sampled by the sampler; and a switch unit configured to transmit the held signal value to the buffer unit.

The apparatus may further include: a stabilizer configured to stabilize a change in a level value of the sampled control pilot input signal.

The apparatus may further include: a capacitor configured to be connected between an output terminal of the switch unit and a ground voltage terminal in parallel; and a resistor.

The sample and hold logic unit may be further configured to sample the control pilot input signal at a timing when the outputted switch control signal becomes a high level and to hold a level value of the sampled control pilot input signal until a timing when the outputted switch control signal again becomes the high level.

Furthermore, according to embodiments of the present disclosure, a charging control system includes an onboard battery charger configured to charge a battery of a vehicle; an electric vehicle supply equipment configured to output a control pilot input signal for supplying power; a device configured to detect a control pilot signal and to sample and hold the outputted control pilot input signal in order to generate the control pilot output signal; and a charging controller configured to output a charging control signal, which controls charging of the onboard battery charger, based on the generated control pilot output signal.

The device may include: a switch controller configured to output a switch control signal using the outputted control pilot input signal; and a sample and hold logic unit configured to sample and hold the outputted control pilot input signal, based on the outputted switch control signal, in order to output a control pilot output signal.

The sample and hold logic unit may include: a sampler configured to sample the outputted control pilot input signal based on the outputted switch control signal; a buffer unit configured to hold a signal value sampled by the sampler; and a switch unit configured to control a transmission of the held signal value to the buffer unit.

Furthermore, according to embodiments of the present disclosure, a method for detecting a level of a control pilot signal includes: outputting, by a switch controller, a switch control signal using a control pilot input signal, which was outputted from an electric vehicle supply equipment; and sampling and holding, by a sample and hold logic unit, the control pilot input signal, based on the outputted switch control signal, in order to output a control pilot output signal.

The method may further include: sampling, by a sampler, the control pilot input signal based on the outputted switch control signal; holding, by a buffer unit, a signal value sampled by the sampler; and controlling, by a switch unit, a transmission of the held signal value to the buffer unit.

The method may further include: stabilizing, by a stabilizer, a change in a level value of the sampled control pilot input signal.

The method may further include: sampling, by the sample and hold logic unit, the control pilot input signal at a timing when the outputted switch control signal becomes a high level; and holding, by the sample and hold logic unit, a level value of the sampled control pilot input signal until a timing when the outputted switch control signal again becomes the high level.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
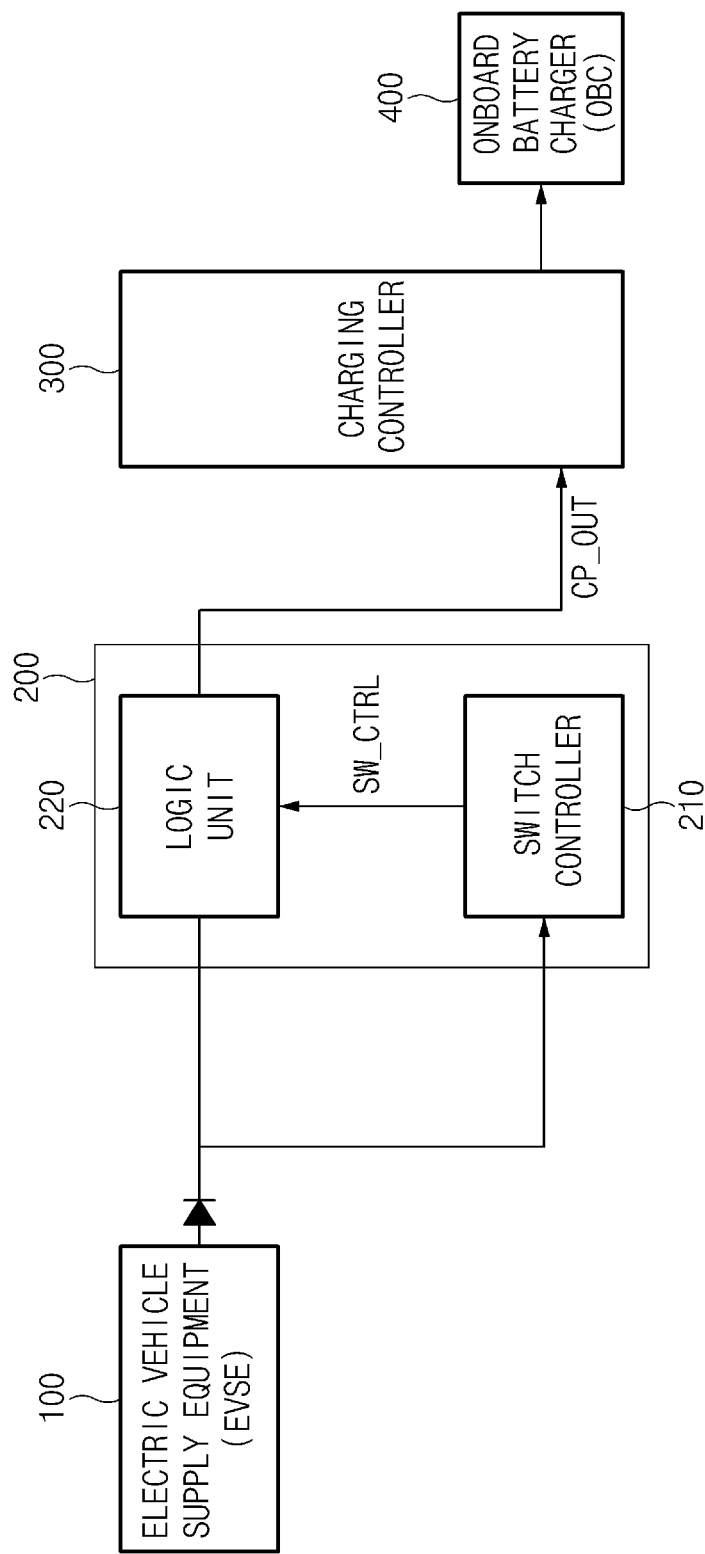
FIG. 1 is a configuration diagram of an OBC charging control system according to embodiments of the present disclosure.

Hereinafter, embodiments of the present disclosure will be described in detail with reference to the accompanying drawings so that those skilled in the art may easily implement the spirit of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one controller. The term "controller" may refer to a hardware device that includes a processor and a memory. The memory may be configured to store program instructions, and the processor may be configured to execute the program instructions to perform one or more processes which are described further below. Moreover, it is understood that the below methods may be executed by an apparatus comprising the controller.

Furthermore, the controller of the present disclosure may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Referring now to the disclosed embodiments, a control pilot signal output from an electric vehicle supply equipment (EVSE) of an electric vehicle has a frequency of 1 kHz, a square wave of 0 to 9V in a charging preparing section, and a square wave of 0 to 6V in a charging section. The control pilot signal is sensed by a charging controller (Micom) and senses a signal at the time of a rising edge per 1 kHz. However, when the control pilot signal does not yet reach a high level or has a ripple, a level may not be accurately detected. Further, the charging controller (Micom) needs to perform the sensing at a frequency of 1 kHz, which gives a burden to the charging controller (Micom) and thus adversely affect other operations, thereby reducing a processing speed. Therefore, the present disclosure discloses a technology of maintaining a control pilot input signal at a predetermined level by passing through a sample and hold logic unit so as to reduce a misdetection of a signal level due to a ripple or a delay and accurately detecting the control pilot input signal.

Hereinafter, embodiments of the present disclosure will be described in detail with reference to FIGS. 1 to 4.

FIG. 1 is a configuration diagram of an OBC charging control system according to embodiments of the present disclosure.

Figure 4:
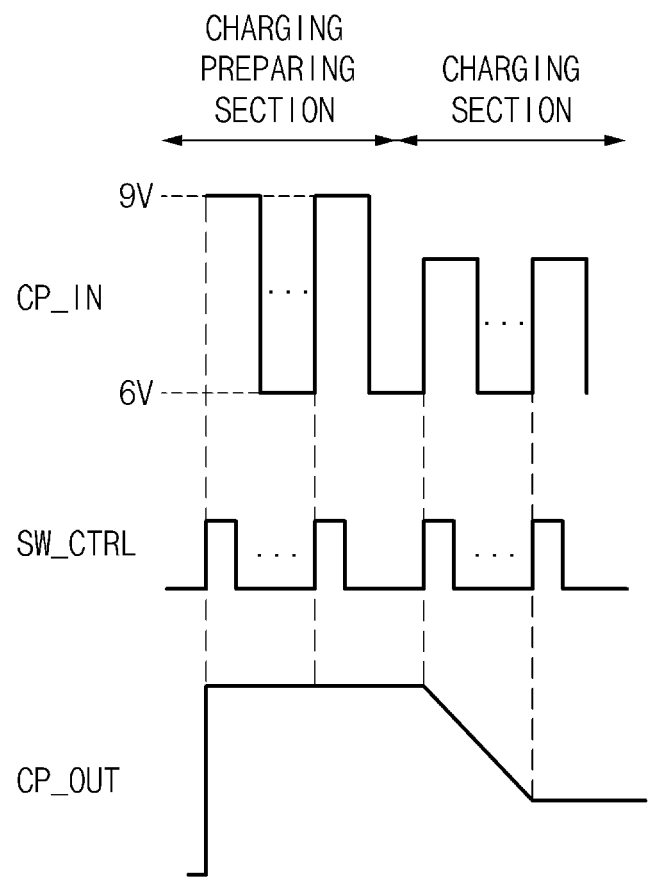
FIG. 4 is a timing diagram of the control pilot signal according to embodiments of the present disclosure.

The OBC charging control system according to embodiments of the present disclosure includes an electric vehicle supply equipment (EVSE) 100, a device 200 for detecting a level of a control pilot signal, a charging control apparatus 300, and an onboard battery charger (OBC) 400. The electric vehicle supply equipment 100 outputs a control pilot signal CP_IN for supplying power of an electric vehicle. In this case, as illustrated in FIG. 4, the control pilot signal CP_IN which is a square wave is a charging preparing section at 9V and a charging section at 6V.

The device 200 for detecting a level of a control pilot signal detects the level of the control pilot input signal CP_IN received from the electric vehicle supply equipment 100 and transmits the detected result to the charging control apparatus 300. In this case, the device 200 for detecting a level of a control pilot signal includes a switch controller 210 and a sample and hold logic unit 220.

The switch controller 210 uses the control pilot input signal CP_IN received from the electric vehicle supply equipment 100 to generate and output a switch control signal SW_CTRL for controlling the sample and hold logic unit 220. EThe sample and hold logic unit 220 samples and holds the control pilot signal received from the electric vehicle supply equipment 100 based on the switch control signal SW_CTRL to output the control pilot output signal CP_OUT.

The charging control apparatus 300 transmits the charging control signal to the onboard battery charger (OBC) 400 which is equipped in the electric vehicle based on a level of a control pilot output signal CP_OUT. EWhen the OBC charging control system having the above configuration outputs the control pilot signal which is a square wave of 0 to 9V at 1 kHz from the electric vehicle supply equipment 100, the charging controller 300 senses the control pilot signal and transmits the sensed result to the onboard battery charger 400. Therefore, the OBC 400 normalizes the operations of all the controllers therein by the square wave of 0 to 9V. When the charging preparation of the OBC 400 is completed, the charging controller 300 receives the square wave of 0 to 6V from the electric vehicle supply equipment 100 and transmits the sensed result to the onboard battery charger 400 to perform the charging. Thus, in order to accurately detect the level of the control pilot signal, the sample and hold logic unit 220 may constantly hold the level of the sampled signal to reduce the burden of the charging controller 300 and accurately detect the level of the control pilot signal.

Figure 2:
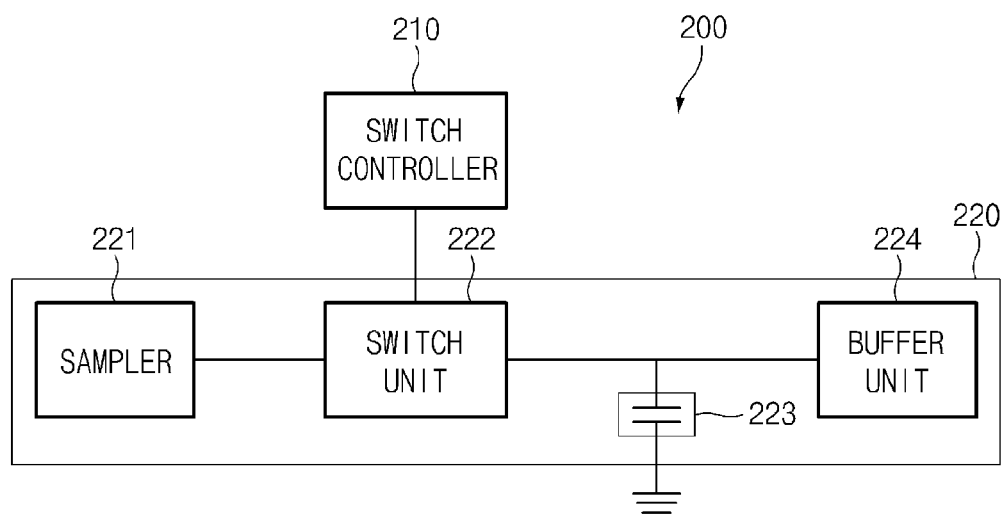
FIG. 2 is a configuration diagram of a device for detecting a level of a control pilot signal according to embodiments of the present disclosure.
Figure 3:
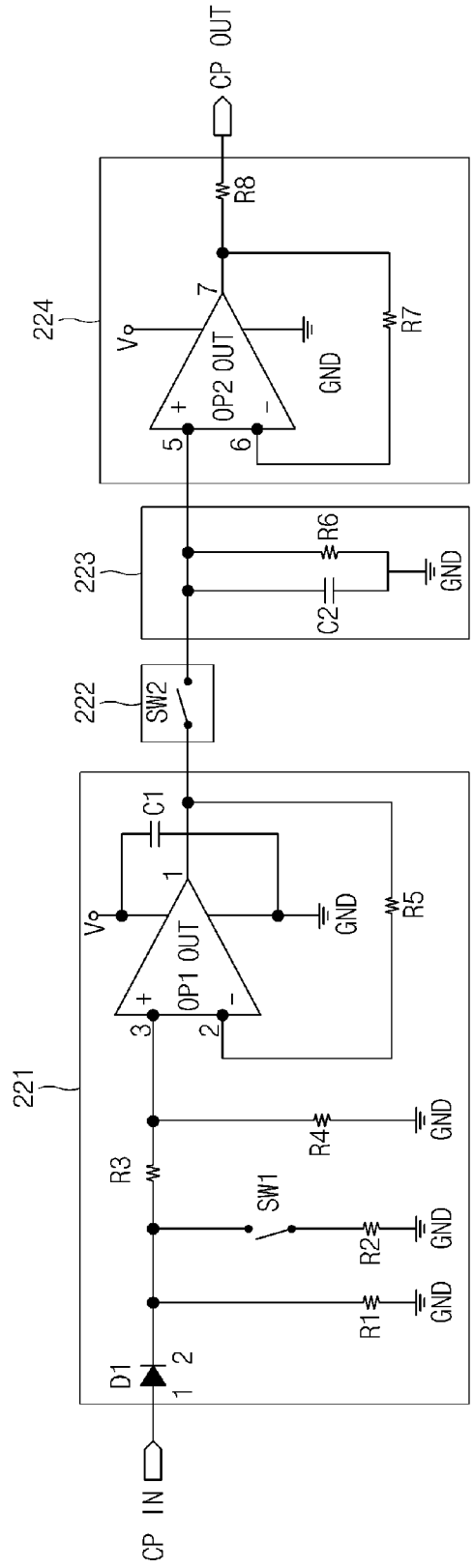
FIG. 3 is a circuit diagram of the device for detecting a level of a control pilot signal according to embodiments of the present disclosure.

FIG. 2 is a configuration diagram of the device for detecting a level of a control pilot signal according to embodiments of the present disclosure, and FIG. 3 is a circuit diagram of the device for detecting a level of a control pilot signal according to embodiments of the present disclosure. Hereinafter, a detailed configuration of the device 200 for detecting a level of a control pilot signal according to embodiments of the present disclosure will be described in detail with reference to FIGS. 2 and 3.

Referring to FIG. 2, the device 200 for detecting a level of a control pilot signal includes a switch controller 210, a sampler 221, a switch unit 222, a stabilizer 223, and a buffer unit 224. As described above, the switch controller 210 generates and outputs a switch control signal SW_CTRL. In this case, the switch control signal SW_CTRL is generated by using the control pilot input signal CP_IN and as illustrated in FIG. 4, has a constant square wave shape.

The sampler 221 performs the sampling on the control pilot input signal CP_IN which is the square wave. That is, referring to the timing diagram of FIG. 4, the sampler 221 samples the control pilot input signal CP_IN at a timing at which the switch control signal SW_CTRL rises to a high level.

Referring to FIG. 3, the sampler 221 includes a diode D1, a switch SW1, resistors R1, R2, R3, R4, and R5, a comparator OP1, and a capacitor C1. The diode D1 and the resistor R3 are connected to each other in series, the resistors R1 and R2 are connected in parallel between a ground voltage terminal GND and an output terminal of the diode D1, and the resistor R4 is connected between an output terminal of the resistor R3 and the ground voltage terminal GND. The comparator OP1 compares an output signal of the resistor R3 with an output signal of the comparator OP1 to differentially amplify the output signals. The switch SW1 is connected to the resistor R2 in series.

The switch unit 222 controls a hold of a signal value which is sampled by the sampler 221. As illustrated in FIG. 3, the switch unit 222 includes a switch SW2 between the output terminal of the comparator OP1 and the stabilizer 223. That is, referring to the timing diagram of FIG. 4, when the switch SW2 is turned off, a level value of the signal sampled by the sampler 221 is transmitted to and held in the buffer unit 224 and when the switch SW2 is turned on, a new sampling signal is applied to the sampler 221 and thus a level value of a new sampling signal is transmitted to and held in the buffer unit 224.

The stabilizer 223 is configured to comprise an RC circuit. The input signal is prevented from being suddenly changed to the level value of the new signal, but rather controlled to be changed in a smoothly curved form. The RC circuit includes a capacitor C2 and a resistor R6 and is connected between an output terminal of the switch SW2 and a ground voltage terminal in parallel.

The buffer unit 224 may buffer and hold the signal applied through the switch unit 222. Referring to FIG. 3, the buffer unit 224 includes a comparator OP2 and resistors R7 and R8. The comparator OP2 receives the output signal of the stabilizer 223 and the output signal of the comparator OP2 to compare the two signals and differentially amplify the signals.

As illustrated in FIG. 4, the control pilot input signal CP_IN is the square wave. Therefore, when the charging controller 300 measures the level, a high level and a low level are alternately input, and thus, a level measurement error may occur. Therefore, the charging controller 300 may accurately recognize the level of the signal by allowing the sample and hold logic unit 220 to maintain the high level value for a predetermined time. That is, even though the control pilot input signal CP_IN is the square wave of 9V, the sample and hold logic unit 220 maintains a DC value of 9V, and thus, the charging controller 300 may stably sense 9V. Therefore, the control pilot signal is accurately sensed without including a digital timer, and the like, and thus, the charging control of the OBC 400, of which the charging is controlled by the charging controller 300, is accurately performed to stably provide the charging of the electric vehicle, thereby increasing power efficiency of the vehicle.

As described above, according to embodiments of the present disclosure, it is possible to increase the accuracy of the charging operation of the vehicle by accurately detecting the level of the control pilot signal.

The embodiments of the present disclosure described above have been provided for illustrative purposes. Therefore, those skilled in the art will appreciate that various modifications, alterations, substitutions, and additions are possible without departing from the scope and spirit of the disclosure as disclosed in the accompanying claims and such modifications, alterations, substitutions, and additions fall within the scope of the present disclosure.

What is claimed is:

1. An apparatus for detecting a level of a control pilot signal, comprising:
a switch controller configured to output a switch control signal using a control pilot input signal, which was outputted from an electric vehicle supply equipment; and
a sample and hold logic unit configured to sample and hold the control pilot input signal, based on the outputted switch control signal, in order to output a control pilot output signal,
wherein the sample and hold logic unit includes:
a sampler configured to sample the control pilot input signal based on the outputted switch control signal;
a switch unit configured to control a hold of a signal value of the sampled signal by the sampler;
a buffer unit configured to hold a signal value of the signal applied through the switch unit;
a stabilizer configured to stabilize a change in a level value of the sampled signal by the sampler and output to the buffer unit.

2. The apparatus according to claim 1, further comprising:
a capacitor configured to be connected between an output terminal of the switch unit and a ground voltage terminal in parallel; and
a resistor.

3. The apparatus according to claim 1, wherein the sample and hold logic unit is further configured to sample the control pilot input signal at a timing when the outputted switch control signal becomes a high level and to hold a level value of the sampled control pilot input signal until a timing when the outputted switch control signal again becomes the high level.

4. A charging control system, comprising:
an onboard battery charger configured to charge a battery of a vehicle;
an electric vehicle supply equipment configured to output a control pilot input signal for supplying power;
a device configured to detect a control pilot signal and to sample and hold the outputted control pilot input signal in order to generate a control pilot output signal; and a charging controller configured to output a charging control signal, which controls charging of the onboard battery charger, based on the generated control pilot output signal, wherein the device includes:
   a switch controller configured to output a switch control signal using the outputted control pilot input signal; and
   a sample and hold logic unit configured to sample and hold the outputted control pilot input signal, based on the outputted switch control signal, in order to output the control pilot output signal;

wherein the sample and hold logic unit includes:
   a sampler configured to sample the control pilot input signal based on the outputted switch control signal;
   a switch unit configured to control a hold of a signal value of the sampled signal by the sampler;
   a buffer unit configured to hold a signal value of the signal applied through the switch unit;
   a stabilizer configured to stabilize a change in a level value of the sampled signal by the sampler and output to the buffer unit.

5. A method for detecting a level of a control pilot signal, comprising:
   outputting, by a switch controller, a switch control signal using a control pilot input signal, which was outputted from an electric vehicle supply equipment;
   sampling, by a sampler, the control pilot input signal based on the outputted switch control signal;
   controlling, by a switch unit, a hold of a signal value of the sampled signal by the sampler;
   holding, by a buffer unit, a signal value of the signal applied through the switch unit; and
   stabilizing, by a stabilizer, a change in a level value of the sampled signal by the sampler and output to the buffer unit.

6. The method according to claim 5, further comprising:
   sampling, by the sample and hold logic unit, the control pilot input signal at a timing when the outputted switch control signal becomes a high level; and
   holding, by the sample and hold logic unit, a level value of the sampled control pilot input signal until a timing when the outputted switch control signal again becomes the high level.

\* \* \* \* \*